(12) United States Patent
Gau et al.

(10) Patent No.: US 6,768,538 B2
(45) Date of Patent: Jul. 27, 2004

(54) PHOTOLITHOGRAPHY SYSTEM TO INCREASE OVERLAY ACCURACY

(75) Inventors: Tsai-Sheng Gau, Hsinchu (TW); Anthony Yen, Austin, TX (US)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 309 days.

(21) Appl. No.: 10/000,933

(22) Filed: Nov. 2, 2001

(65) Prior Publication Data

US 2003/0087192 A1 May 8, 2003

(51) Int. Cl.⁷ .............................................. G03B 27/42
(52) U.S. Cl. ........................................................ 355/53
(58) Field of Search ............................. 355/53, 27, 77; 414/938–941

(56) References Cited

U.S. PATENT DOCUMENTS

| | | | | |
|---|---|---|---|---|
| 5,442,416 A | * | 8/1995 | Tateyama et al. | ........... 396/612 |
| 5,803,932 A | * | 9/1998 | Akimoto et al. | ........... 29/25.01 |
| 5,841,515 A | * | 11/1998 | Ohtani | ........................ 355/27 |
| 5,995,200 A | * | 11/1999 | Pierrat | ......................... 355/53 |

* cited by examiner

Primary Examiner—Russell Adams
Assistant Examiner—D. Ben Esplin
(74) Attorney, Agent, or Firm—Tung & Associates

(57) ABSTRACT

A semiconductor photolithography system to improve overlay accuracy is disclosed. Such a system can include an exposure tool, at least one track, and a number of photoresist modules. The exposure tool performs functionality related to both at least a front-end and a back-end wafer. Each track has one or more paths to and from the exposure tool. The photoresist modules each perform functionality related to photoresist, on only either the front-end wafer or the back-end wafer, not both. Each module is located on one of the tracks. More specifically, a two-track system is disclosed, where each track has a path to and from the exposure tool, and a single-track system is disclosed having two paths to and from the exposure tool.

9 Claims, 8 Drawing Sheets

PHOTOLITHOGRAPHY SYSTEM TO INCREASE OVERLAY ACCURACY

FIELD OF THE INVENTION

This invention relates generally to photolithography systems for semiconductor processing, and more particularly to such a system for increasing overlay accuracy.

BACKGROUND OF THE INVENTION

Patterning is one of the basic steps performed in semiconductor processing. It also referred to as photolithography, masking, oxide or metal removal, and microlithography. Patterning enables the selective removal of material deposited on a semiconductor substrate, or wafer, as a result of a deposition process. For example, as shown in FIG. 1A, a layer 104 has been deposited on a substrate 102. After the photolithography process is performed, as shown in FIG. 1B, some parts of the layer 104 have been selectively removed, such that gaps 106a and 106b are present within the layer 104. A photomask, or pattern, is used (not shown in FIG. 1B) so that only the material from the gaps 106a and 106b are removed, and not the other portions of the layer 104. The process of adding layers and removing selective parts of them, in conjunction with other processes, permits the fabrication of semiconductor devices.

Alignment is critical in photolithography and deposition, as well as in other semiconductor processes. If layers are not deposited properly, or if they are not selectively removed properly, the resulting semiconductor devices may not function, relegating them to scrap, which can be costly. Such misalignment, or overlay shift, is shown in FIG. 2. The layer 204 may or may not be deposited in a properly aligned configuration on the substrate 202, whereas subsequent deposition layers 206a, 206b, . . . , 206n are misaligned. This is indicated by the reference marks 210a, 210b, . . . , 210n, which are shown in FIG. 2 for illustrative clarity only. The reference marks 210a, 210b, . . . , 210n, should substantially align over the alignment marks 208 of the substrate 202, but they do not.

In comparison to FIG. 2, correctly aligned layers are shown in FIG. 3. The semiconductor wafer 202 has alignment marks 208. The layer 204 is aligned thereupon. Similarly, the layers 206a, 206b, . . . , 206n are deposited upon the layer 204, without any, or with minimal, overlay shift. This is indicated by the reference marks 210a, 210b, . . . , 210n aligning with the alignment marks 208 of the wafer 202.

Alignment errors such as overlay shift are also referred to as overlay error or misalignment. A common error is a simple misplacement of a layer in the x and/or y directions. Another overlay error is rotational, where one side of the wafer is aligned, but patterns become increasingly misaligned across the wafer. Other misalignment problems associated with masks and stepper aligners are run-out and run-in. These problems arise when the chip patterns are not formed on the mask on constant centers, or are placed on the chip off center. The result is that only a portion of the mask chip patterns can be properly aligned to the wafer patterns, such that the pattern becomes progressively misaligned across the wafer.

A common rule of thumb is that circuits with micron or sub-micron feature sizes must meet registration tolerances of one-third the minimum critical feature size. An overlay budget is therefore determined for the total circuit. The overlay budget is the allowable accumulated alignment error for the entire mask set. For example, for a 0.35-micron product, the allowable overlay budget is usually about 0.1 micron.

Overlay error can thus be caused by limitations in scanner or stepper stage accuracy, limitations in magnification accuracy, lens distortion, lens aberrations, such as focus, spherical, coma, and astigmatism aberrations, as well as other limitations, errors, distortions, and aberrations. Scanners and steppers are semiconductor exposure equipment, or tools, used to align a photomask over a semiconductor wafer, and then expose the wafer through the photomask. Such equipment usually has a tolerance range or otherwise has a limited accuracy, such that overlay error can result. Limitations in magnification accuracy result from the masks have a greater size than the resulting exposed image on the wafer, resulting in overlay error. Distortions and aberrations in the lenses of scanners and steppers also cause overlay error.

Conventional approaches to correct overlay error include adjusting the stage, magnification, and/or field rotation and translation to compensate for overlay errors between different layers being deposited and/or exposed. That is, between the deposition and/or exposure of different layers on the semiconductor wafer, scanner and stepper parameters such as the stage, magnification, and field rotation and translation may be varied to account and compensate for and correct overlay error. However, typically there is residual overlay error that cannot be corrected. For instance, the use of different exposure tools and equipment for different layers of the semiconductor device can be responsible for residual overlay error. Different scanners and steppers have different types of lens, with specific signatures of distortion and aberrations, causing pattern placement error.

Matching different exposure tools to one another is a difficult process, because different scanners and steppers have different overlay specifications. As an example, one scanner may have an overlay specification of 35 nanometers (nm), whereas another scanner may have an overlay specification of 55 nm. Even if these two scanners can be theoretically matched, tolerances in their overlay accuracy may further impede matching in actuality. For instance, the former scanner may actually have an overlay specification of 20 nm, whereas the latter scanner may actually have a specification of 45 nm. Matching the scanners in theory, in other words, still causes overlay error in actuality.

FIG. 4 shows an example of such a conventional two-exposure tool photolithography system 400. The system includes a pre-exposure track 402, an exposure tool 404, and a post-exposure track 406 for a front-end wafer 412A, and a pre- and post-exposure track 408 and an exposure tool 410 for a back-end wafer 412B. The back-end wafer 412B can be the front-end wafer 412A after it has been processed by the pre-exposure track 402, the exposure tool 404, and the post-exposure track 406. The tracks 402, 406, and 408 are tracks in that a continual number of wafers can be moved through them in an automated line approach. The exposure tool 404 typically has different overlay specifications than that of the exposure tool 410, such that use of the two tools 404 and 410 results in residual overlay error.

The pre-exposure track 402 handles processes that affect the photoresist prior to exposure by the exposure tool 404. These include applying the photoresist, and soft baking the photoresist. Photoresist application is usually by spinning photoresist onto the semiconductor wafer. Spinning may be static, dynamically dispensed, dispensed by a moving arm, manually spun, and/or automatically spun, among other approaches. Furthermore, a backside coating may be applied, which is coating the back of the wafer with photoresist. Soft baking is a heating operation to evaporate a portion of the solvents in the photoresist. The resist film is still soft after the soft bake, as opposed to being baked to a varnish-like finish. Soft baking can be accomplished by convection ovens, manual hot plates, in-line single-wafer hot plates, moving-belt hot plates, moving-belt infrared ovens, microwave baking, and/or vacuum baking, among other approaches.

The exposure tool 404 usually performs both alignment and exposure. Alignment is the position of the required image on the wafer surface, whereas exposure is the encoding of the image in the photoresist layer by exposing light or another radiation source. The exposure tool 404 may be or include a stepper or a scanner. Different types of aligners include optical aligners, such as contact, proximity, scanning projection, and stepper aligners, and non-optical aligners, such as x-ray and e-beam aligners.

The post-exposure track 406 handles processes that affect the photoresist after exposure by the exposure tool 404. These include developing the photoresist to remove the exposed photoresist, and hard baking the remaining, undeveloped and unexposed photoresist. Development techniques are designed to leave in the resist layer an exact copy of the pattern that was on the photomask or reticle. Development may be wet development, such as immersion, spray development, puddle development, and plasma descumming, or dry development, which is also known as plasma development. Hard baking is a heating operation to evaporate a portion of the solvents in the photoresist, similar to soft baking. However, the goal of hard baking is to achieve good adhesion of the resist to the wafer surface. Like soft baking, hard baking may be performed by convection ovens, in-line and manual hot plates, infrared ovens, moving-belt conduction ovens, and vacuum ovens.

The pre- and post-exposure track 408 includes the functionality of both the pre-exposure track 402 and the post-exposure track 404, but for the back-end wafer 412B instead of the front-end wafer 412A. The consolidation of pre-exposure and post-exposure functionality into a single track 408 is shown for example purposes only. The dual functionality of the track 408 could also be separated into two single tracks, like the tracks 402 and 404 are for the front-end wafer 412A. Similarly, he exposure tool 410 assumes the functionality of the exposure tool 404, but for the back-end wafer 412B instead of the front-end wafer 412A.

Ideally, a single scanner or stepper is used to expose all critical layers of a semiconductor device, which are the layers in which critical dimensions (CD's) are present. However, in the prior art, it is not possible to use a single machine to expose all the critical layers. For example, to compensate for potential contamination between layers, fabrication of semiconductor devices that use copper usually employs one scanner or stepper for front-end processes, and another scanner or stepper for back-end processes. Front-end processes are those that process first layers of a device, whereas back-end processes are those that process the last layers of a device. Since overlay error must be significantly reduced as semiconductor feature size is reduced, to 0.13 micron and below, the inability to compensate for residual overlay error becomes a serious problem in semiconductor device fabrication.

Therefore, there is a need to improve overlay accuracy between layers of a semiconductor device, especially such layers that are critical. Such an improvement in accuracy should decrease residual overlay error. This improvement in overlay accuracy may also result from using a single scanner, stepper, or other exposure tool. For these and other reasons, there is a need for the present invention.

SUMMARY OF THE INVENTION

The invention relates to a semiconductor photolithography system to improve overlay accuracy. Such a system can include an exposure tool, at least one track, and a number of photoresist modules. The exposure tool performs functionality related to both at least a front-end and a back-end wafer. Each track has one or more paths to and from the exposure tool. The photoresist modules each perform functionality related to photoresist, on only either the front-end wafer or the back-end wafer, not both. Each module is located on one of the tracks.

In one two-track system of the invention, there is a first track for the front-end wafer and a second-track for the back-end wafer. The first track has a single path for the front-end wafer, whereas the second track has a single path for the back-end wafer. In one one-track system of the invention, there is only a single track that has two paths. One of the paths is for the front-end wafer, and the other of the paths is for the back-end wafer.

The invention provides for advantages over the prior art. Overlay accuracy is improved because residual overlay error is decreased. Since front-end and back-end wafer processing is performed on the same exposure tool, no matching between disparate exposure tools is required. Still other advantages, embodiments, and aspects of the invention will become apparent by reading the detailed description that follows, and by referencing the attached drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1A:
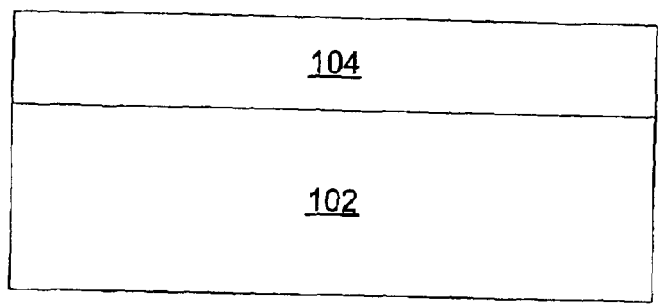
FIGS. 1A and 1B are diagrams showing the effect of patterning on a layer deposited on a semiconductor wafer.
Figure 1B:
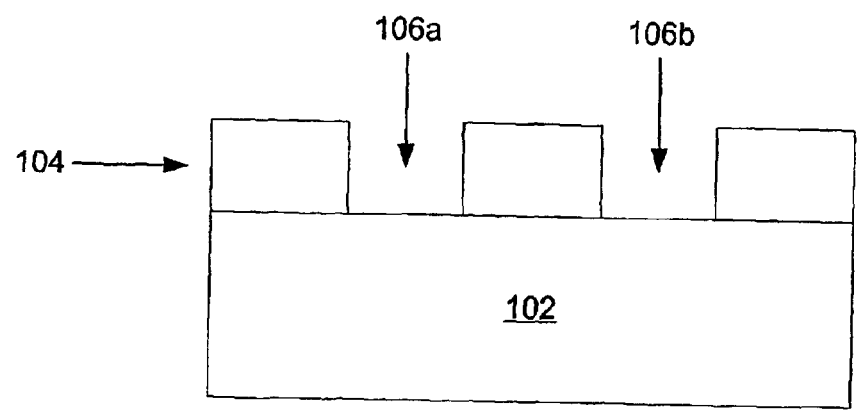
Figure 2:
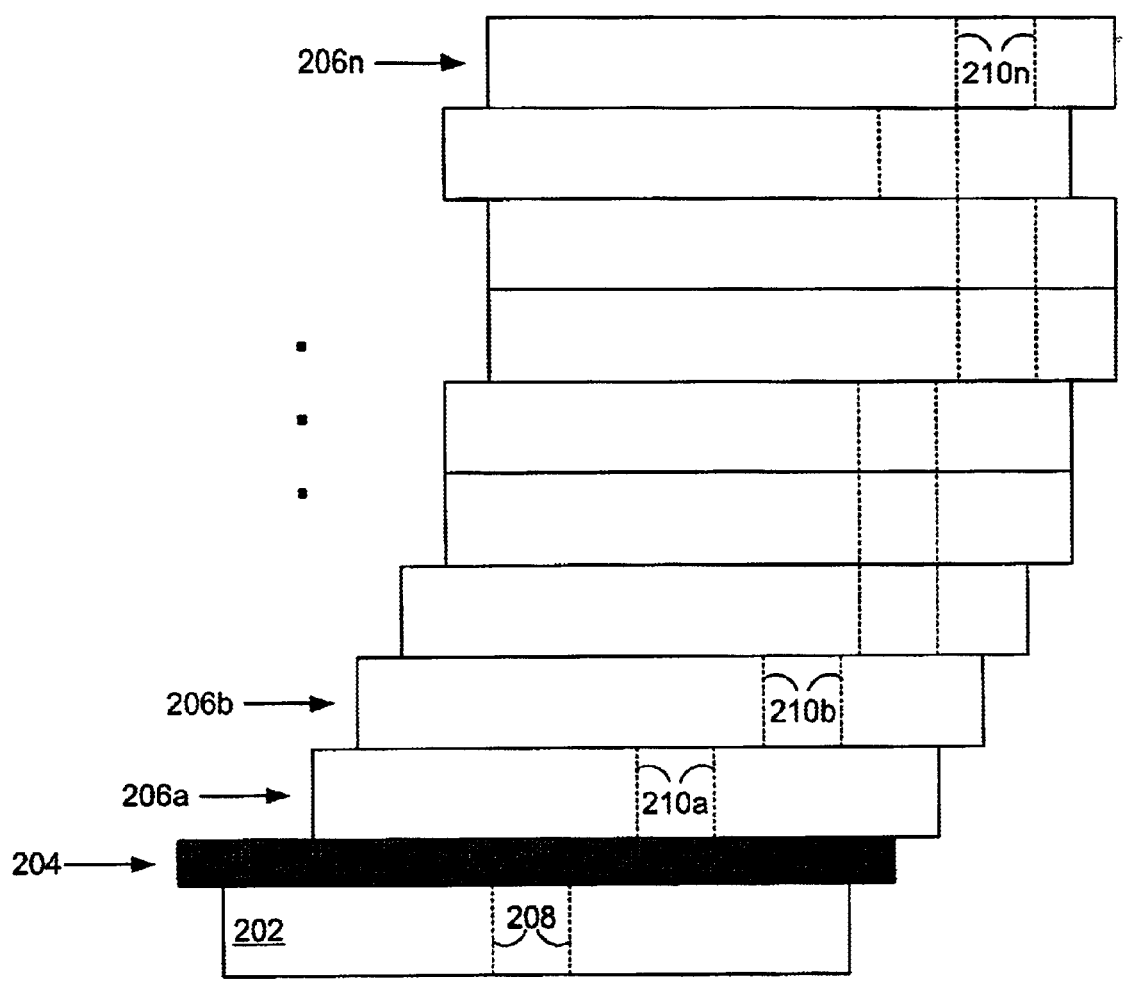
FIG. 2 is a diagram showing the overlay shift that results when depositing and exposing subsequent layers on a layer deposited on a semiconductor wafer.
Figure 3:
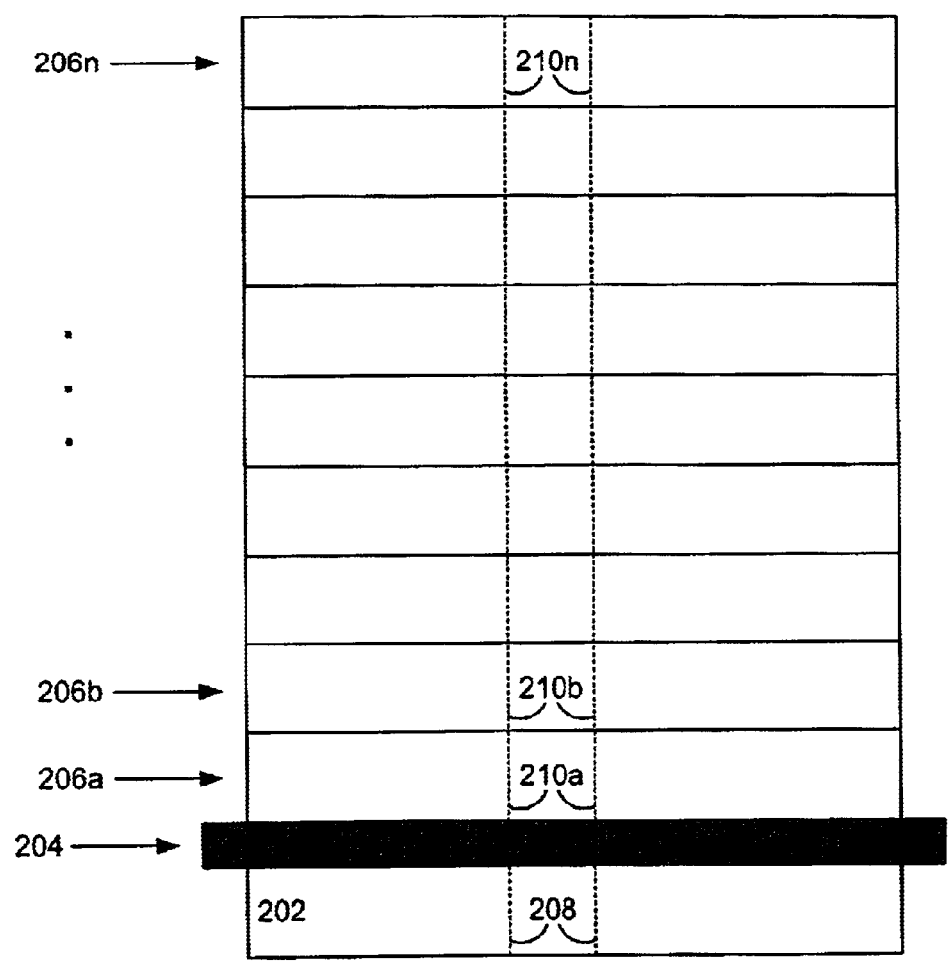
FIG. 3 is a diagram showing, in comparison to that of FIG. 2, how multiple deposited and exposed layers without overlay shift appear on a semiconductor wafer.
Figure 4:
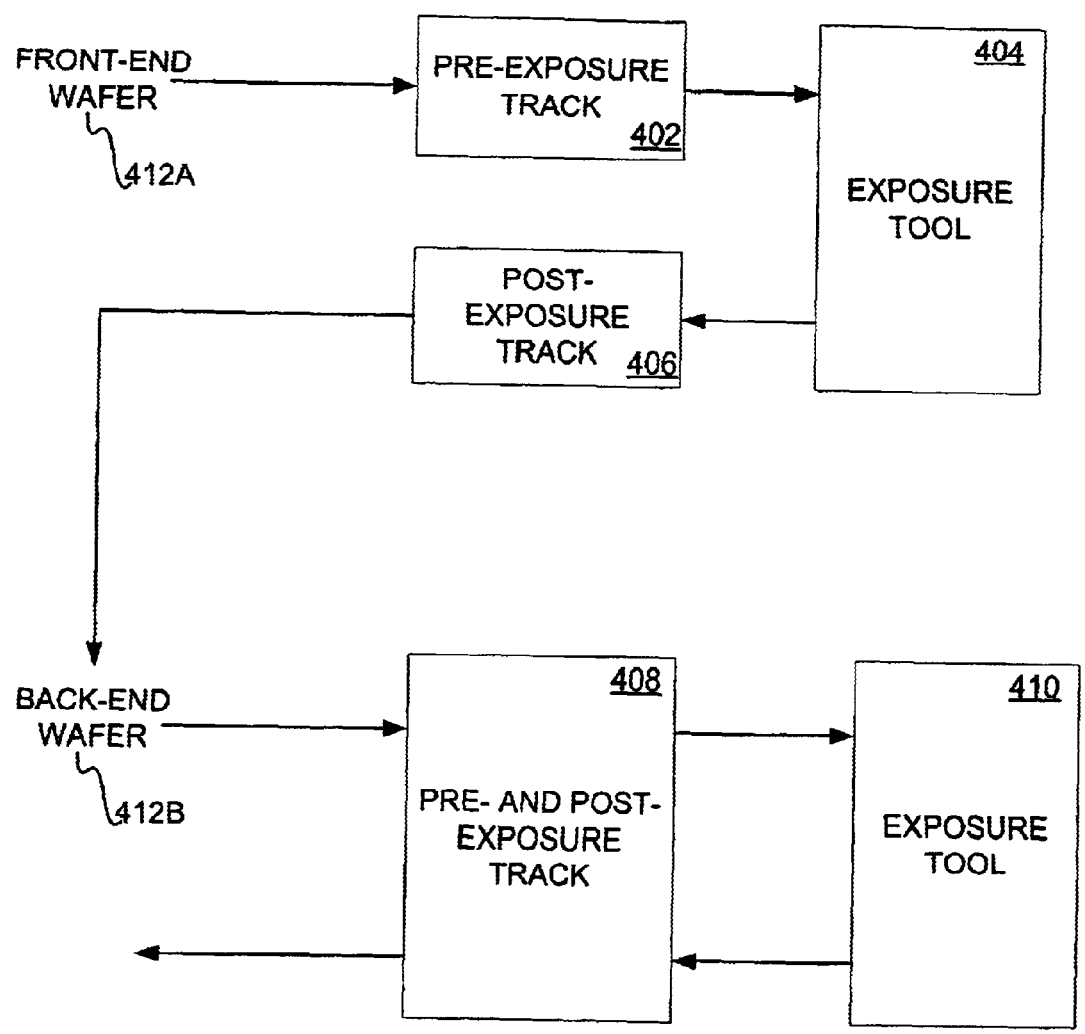
FIG. 4 is a diagram of a conventional photolithography system in the prior art.
Figure 5:
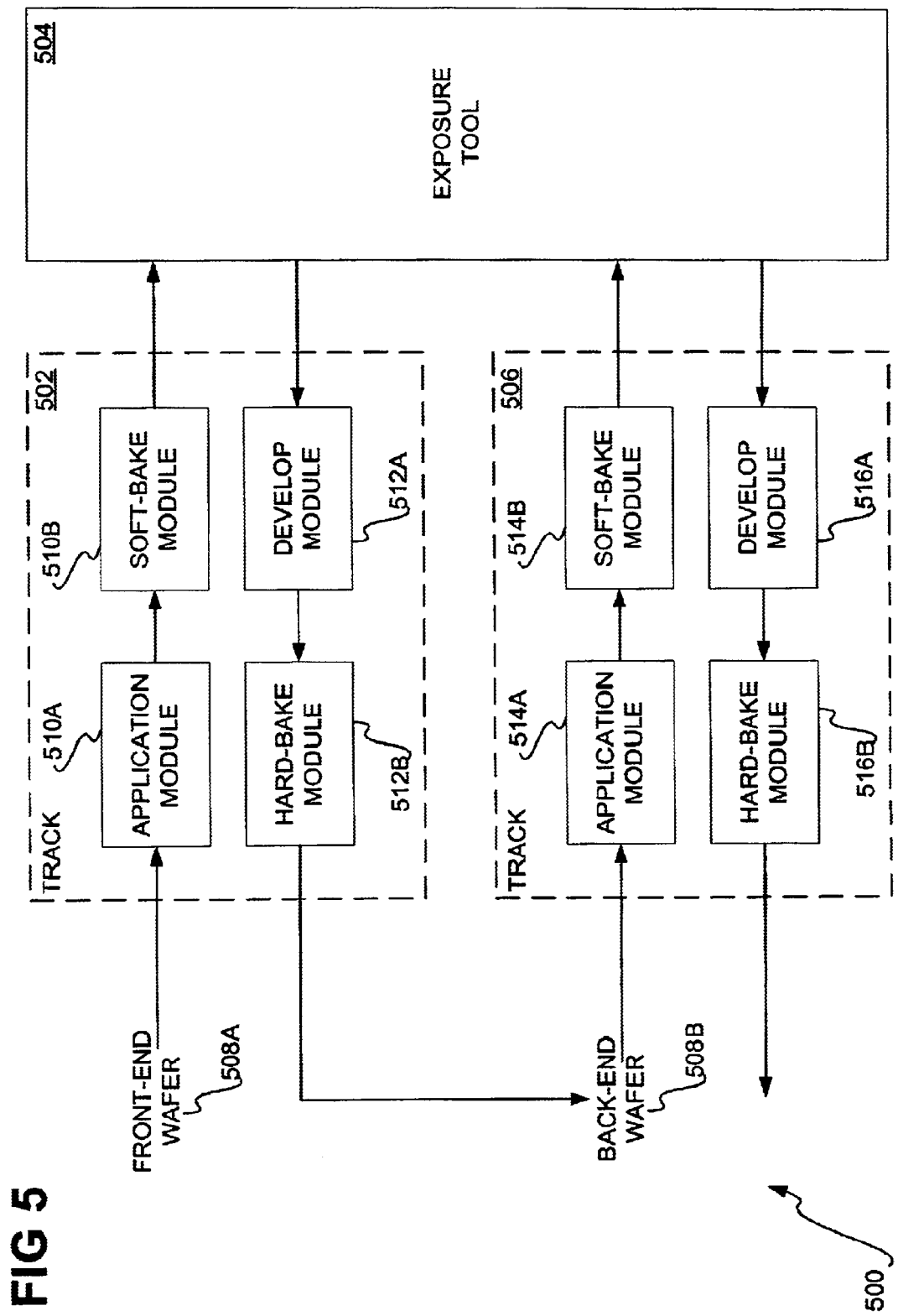
FIG. 5 is a diagram of a two-track photolithography system according to an embodiment of the invention.

FIG. 5 shows a two-track photolithography system 500. The system 500 includes a front-end track 502, an exposure tool 504, and a back-end track 506. The front-end track 502 is for performing photoresist-related functionality to the front-end wafer 508A, whereas the back-end track 506 is for performing photoresist-related functionality to the back-end wafer 508B. The front-end track 502 includes a number of pre-exposure modules 510A and 510B, and a number of post-exposure modules 512A and 512B. The back-end track 506 also includes a number of pre-exposure modules 514A and 514B, and a number of post-exposure modules 516A and 516B. The modules of the front-end track 502 are mutually exclusive with the modules of the back-end track 506. A module of the front-end track 502 cannot also be a module of the back-end track 506, and vice-versa.

The tracks 502 and 506 can be movable tracks, on which wafers, such as the front-end wafer 508A and the back-end wafer 508B, respectively, may be placed for photoresist-related processing, both before and after the wafers have been exposed by the exposure tool 504. One track, the track 502, is thus used for the front-end wafer 508A, whereas another track, the track 506, is used for the back-end wafer 508B. The exposure tool 504 may be or include an exposure tool such as a scanner, a stepper, or another type of exposure tool.

As shown in FIG. 5, the pre-exposure modules 510A and 510B of the front-end track 502 and the pre-exposure modules 514A and 514B of the back-end track 506 include a photoresist application module 510A and 514A, respectively, and a soft-bake module 510B and 514B, respectively. The application modules 510A and 514A apply photoresist to the wafer, such as by spinning the photoresist onto the wafer. A backside coating may also be applied to the wafer, in the same or a separate module. The soft-back modules 510B and 514B perform a soft-bake operation on the pre-exposed wafer.

The post-exposure modules 512A and 512B of the front-end track and the post-exposure modules 516A and 516B of the back-end track 506 include a develop module 512A and 516A, respectively, and a hard-bake module 512B and 516B, respectively. The develop modules 512A and 516A develop the exposed photoresist on the wafer. The hard-bake modules 512B and 516B perform a hard-bake operation on the exposed and developed wafer.

The front-end wafer 508A moves on a path on the track 502 through the pre-exposure photoresist modules 510A and 510B of the track 502, where these modules perform photoresist-related functionality. The path continues to the exposure tool 504, where the front-end wafer 508A is exposed according to a semiconductor device pattern. The path then continues from the exposure tool 504 through the post-exposure photoresist modules 512A and 512B of the track 502, where these modules perform further photoresist-related functionality. There is thus a single track 502 for the front-end wafer 508A, having a single path to and from the exposure tool 504.

After front-end processing, the front-end wafer 508A becomes the back-end wafer 508B. The back-end wafer 508B moves on a path on the track 506 through the pre-exposure photoresist modules 514A and 514B of the track 506, where these modules perform photoresist-related functionality. The path continues to the exposure tool 504, where the back-end wafer 508B is exposed according to a semiconductor device pattern. The same exposure tool 504 is thus used to expose both the front-end wafer 508A and the back-end wafer 508B. The path then continues from the tool 504 through the post-exposure photoresist modules 516A and 516B of the track 506, where these modules perform further photoresist-related functionality. There is thus a single track 506 for the back-end wafer 508B, having a single path to and from the tool 504.

Figure 6:
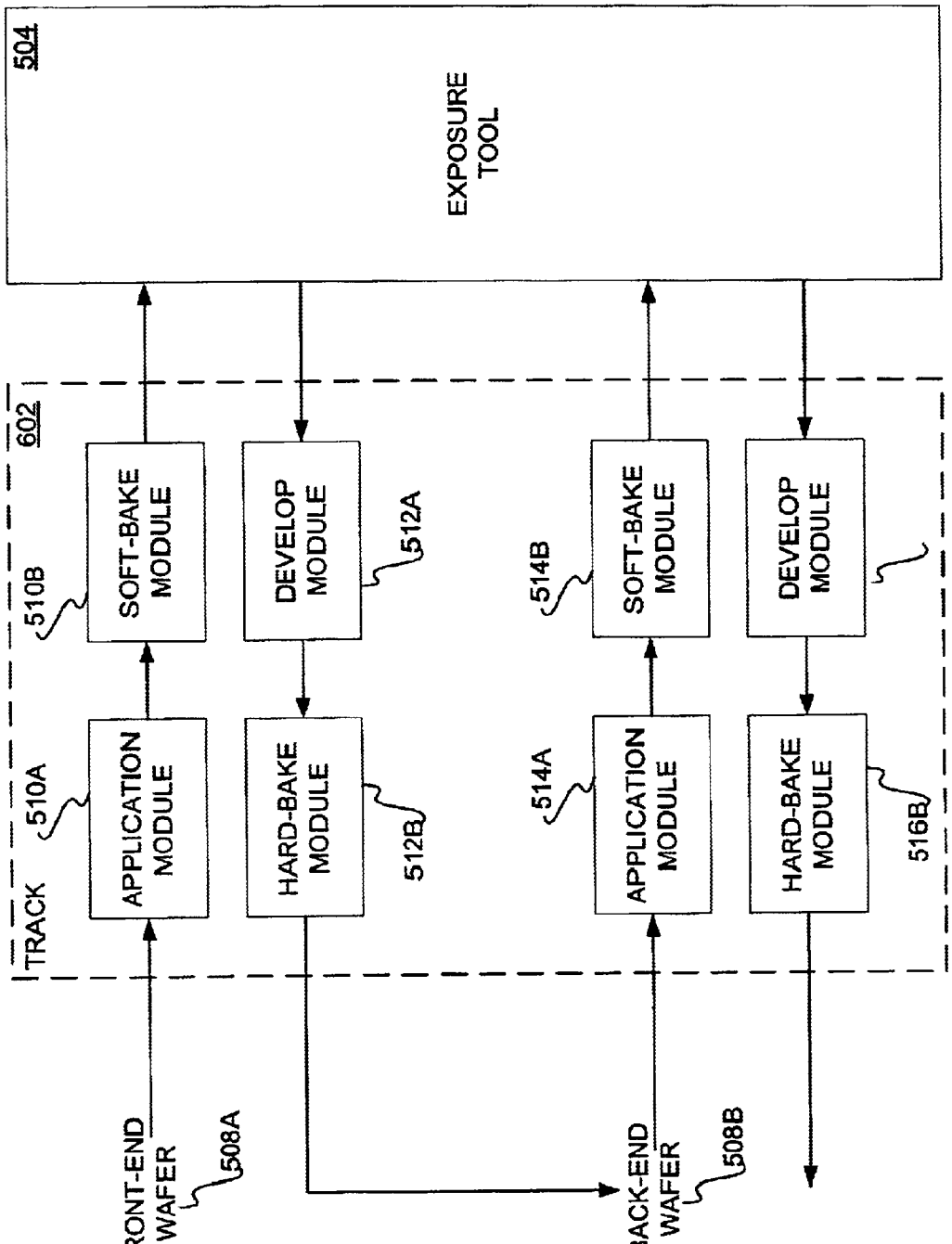
FIG. 6 is a diagram of a one-track photolithography system according to an embodiment of the invention.

FIG. 6 shows a one-track photolithography system 600. The system 600 includes a single track 602 and the exposure tool 504. The single track 602 is for performing photoresist-related functionality to both the front-end wafer 508A and the back-end wafer 508B. The track 602 includes a number of pre-exposure modules 510A and 510B and a number of post-exposure modules 512A and 512B for front-end wafer processing, and a number of pre-exposure modules 514A and 514B and a number of post-exposure modules 516A and 516B for back-end wafer processing. The front-end wafer processing modules are mutually exclusive with the back-end wafer processing modules. A module of the former cannot also be a module of the latter, and vice-versa.

The track 602 can be a movable track on which front-end and back-end wafers may be placed for photoresist processing, both before and after the wafers have been exposed by the exposure tool 504. The front-end wafer 508A moves on a path on the track 602 through the pre-exposure photoresist modules 510A and 510B, where these modules perform photoresist-related functionality. The path continues to the exposure tool 504, where the front-end wafer 508A is exposed. The path then continues from the tool 504 through the post-exposure photoresist modules 512A and 512B, where further photoresist-related functionality is performed. There is thus one path on the track 602 for the front-end wafer 508A.

After front-end processing, the front-end wafer 508A becomes the back-end wafer 508B. The back-end wafer 508B moves on another path on the track 602, through the pre-exposure photoresist modules 514A and 514B, where these modules perform photoresist-related functionality. The path continues to the exposure tool 504, where the back-end wafer 508B is exposed. The same exposure tool 504 is thus used to expose both the front-end wafer 508A and the back-end wafer 508B. The path then continues from the tool 504 through the post-exposure photoresist modules 516A and 516B, where further photoresist-related functionality is performed. There is thus one path on the track 602 for the back-end wafer 508B as well.

Figure 7:
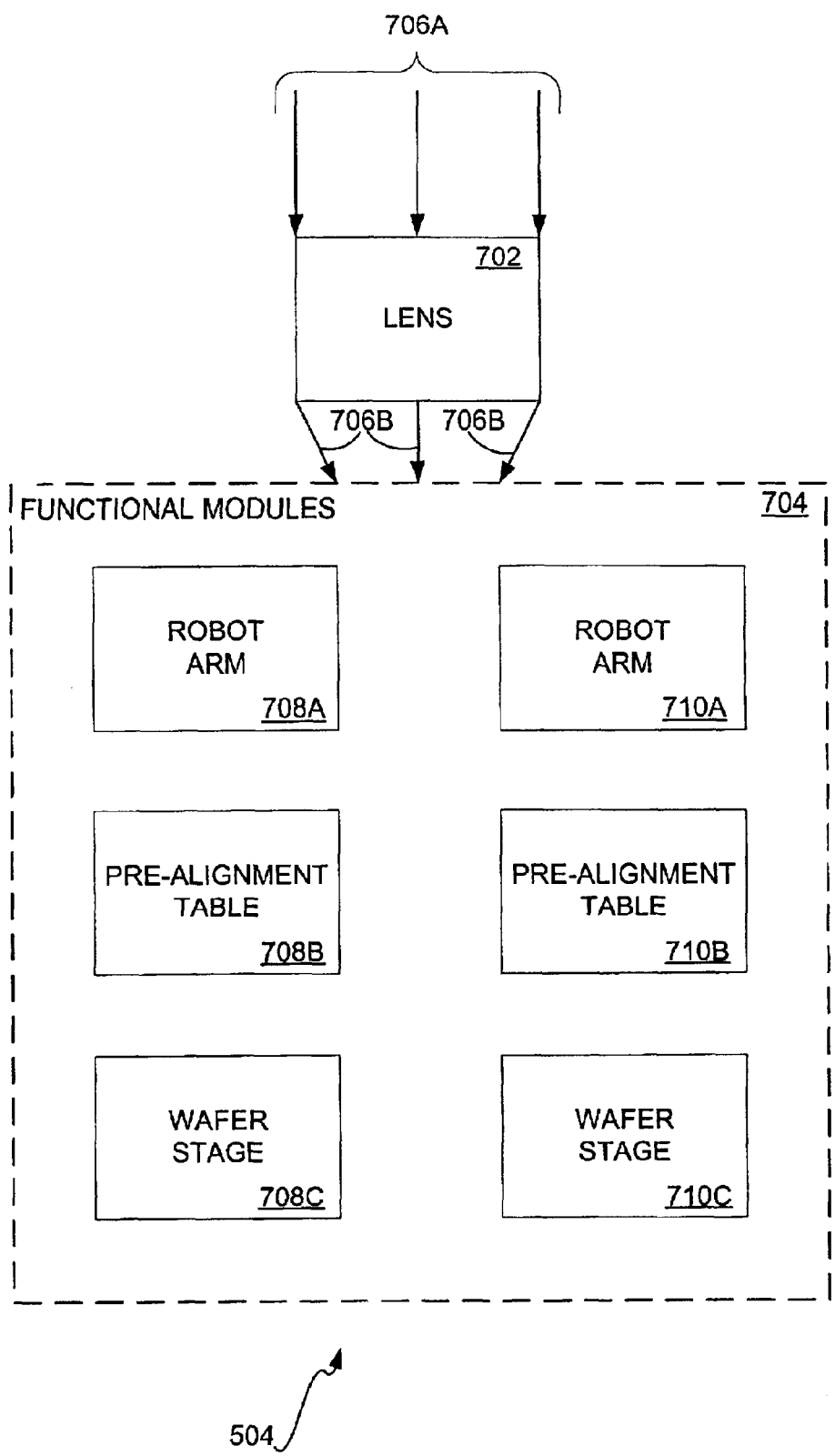
FIG. 7 is a diagram of an exposure tool according to an embodiment of the invention.

FIG. 7 shows an exposure tool 504 according to an embodiment of the invention. The exposure tool 504 may be or include a scanner, stepper, or another type of exposure equipment. The exposure tool 504 includes a lens 702, which may be part of exposure equipment such as a scanner or a stepper, and functional modules 704. Light 706A is directed by the lens 702 to become the light 706B that is used to expose a device image on a semiconductor wafer. The functional modules 704 include functional modules for performing exposure-related functionality for the semiconductor wafer.

The functional modules 704 of FIG. 7 specifically include robot arms 708A and 710A, pre-alignment tables 708B and 710B, and wafer stages 708C and 710C. The modules 708A, 708B, and 708C are for the front-end wafer 508A, whereas the modules 710A, 710B, and 710C are for the back-end wafer 508B. The functional modules 708A, 708B, and 708C are preferably mutually exclusive with the functional modules 710A, 710B, and 710C. That is, preferably no functional module for the front-end wafer 508A is also used for the back-end wafer 508B.

The robot arms 708A and 710A are for removing a wafer from a track for exposure and other processing by the exposure tool 504, such as to place the wafer on the wafer stages 708C and 710C, respectively. The pre-alignment tables 708B and 710B can be for properly aligning the wafer prior to exposure by the exposure tool 504. The wafer stages 708C and 710C are the stages where the wafer sits while it is being exposed by the exposure tool 504.

Figure 8:
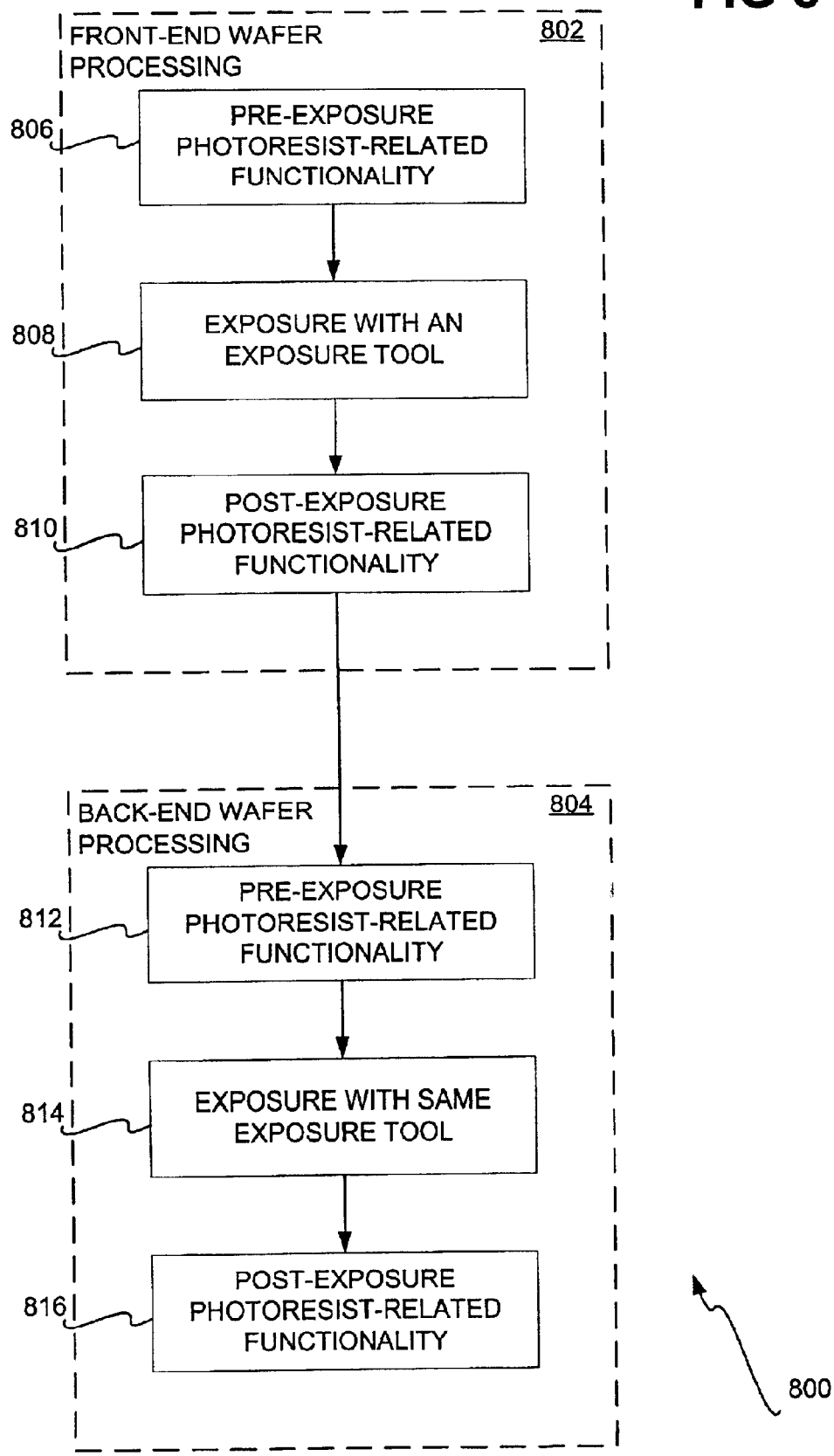
FIG. 8 is a flowchart of a method according to an embodiment of the invention.

FIG. 8 shows a method 800 that can be performed in conjunction with the embodiments of FIGS. 5, 6, and/or 7 of the invention, or by itself. The method 800 includes front-end wafer processing (802) and back-end wafer processing (804). The front-end wafer processing includes performing pre-exposure photoresist-related functionality (806), exposure with an exposure tool (808), and performing post-exposure photoresist-related functionality (810). The back-end wafer processing also includes performing pre-exposure photoresist-related functionality (812), exposure with an exposure tool (814), and performing post-exposure photoresist-related functionality (816).

The pre-exposure photoresist-related functionality can include application of photoresist to the wafer, as well as soft baking. The post-exposure photoresist-related functionality can include development of the photoresist, as well as hard baking. The exposure tool used in the front-end processing is the same exposure tool used in the back-end processing, which improves overlay accuracy by decreasing residual overlay error that may result from having to match two different exposure tools.

The front-end processing may be performed on a separate track than the back-end processing, where each track has one path to and from the exposure tool. Alternatively, the front-end processing may be performed on the same track as the back-end processing, where there is both a front-end and a back-end path to and from the exposure tool. The exposure tool may have functional modules exclusively for performing front-end exposure-related functionality, and different functional modules exclusively for performing back-end exposure-related functionality.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. For example, whereas the embodiment of FIG. 5 is a two-track system, there may be more than two tracks, where each track performs photoresist-related functionality exclusively for a different type of wafer, and where each track has a path to and from the exposure tool.

As another example, whereas the embodiment of FIG. 6 is a two-path, one-track system, there may be more than two paths, where each path has photoresist-related functionality modules exclusively for a different type of wafer, and where each path is to and from the exposure tool. Whereas particular types of photoresist-related modules have been shown, both pre-exposure and post-exposure such modules in FIGS. 5 and 6, the invention is also applicable to other such modules, either in lieu of or in addition to any of the modules of FIGS. 5 and 6. Therefore, it is manifestly intended that this invention be limited only by the claims and equivalents thereof.

What is claimed is:

1. A semiconductor photolithography system comprising:

an exposure tool adapted to perform functionality related to each of a front-end wafer and a back-end wafer;

one or more pre-exposure front-end photoresist modules to perform pre-exposure functionality related to photoresist on the front-end wafer;

one or more post-exposure front-end photoresist modules to perform post-exposure functionality related to photoresist on the front-end wafer;

one or more pre-exposure back-end photoresist modules to perform pre-exposure functionality related to photoresist on the back-end wafer;

one or more post-exposure back-end photoresist modules to perform post-exposure functionality related to photoresist on the back-end wafer;

a first track on which the pre-exposure and the post-exposure front-end photoresist modules are located, the first track able to transport the front-end wafer to the exposure tool such that the pre-exposure front-end photoresist modules perform the pre-exposure functionality on the front-end wafer prior to performance by the exposure tool of the functionality related to the front-end wafer, the first track further able to transport the front-end wafer away from the exposure tool such that the post-exposure front-end photoresist modules perform the post-exposure functionality on the front-end wafer after performance by the exposure tool of the functionality related to the front-end wafer; and, a second track on which the pre-exposure and the post-exposure back-end photoresist modules are located, the second track able to transport the back-end wafer to the exposure tool such that the pre-exposure back-end photoresist modules perform the pre-exposure functionality on the back-end wafer prior to performance by the exposure tool of the functionality related to the back-end wafer, the second track further able to transport the back-end wafer away from the exposure tool such that the post-exposure back-end photoresist modules perform the post-exposure functionality on the back-end wafer after performance by the exposure tool of the functionality related to the back-end wafer.

2. The system of claim 1, wherein the exposure tool performing the functionality related to each of at least the front-end wafer and the back-end wafer improves overlay accuracy.

3. The system of claim 1, wherein the exposure tool comprises a first set of functional modules for performing the functionality related to the front-end wafer, and a second set of functional modules for performing the functionality related to the back-end wafer, the second set of functional modules mutually exclusive with the first set of functional modules.

4. The system of claim 1, wherein the exposure tool is one of a scanner and a stepper.

5. A method comprising:

performing a plurality of front-end pre-exposure photoresist-related functionality on a wafer, the wafer moving on a first track closer towards an exposure tool after each front-end pre-exposure photoresist-related functionality is performed;

front-end exposing the wafer using the exposure tool, the first track leading to and from the exposure tool;

performing a plurality of front-end post-exposure photoresist-related functionality on the wafer, the wafer moving on the first track farther away from the exposure tool after each front-end post-exposure photoresist-related functionality is performed;

performing a plurality of back-end pre-exposure photoresist-related functionality on the wafer, the wafer moving on a second track closer towards the exposure tool after each back-end pre-exposure photoresist-related functionality is performed;

back-end exposing the wafer using the exposure tool used to front-end expose the wafer the second track leading to and from the exposure tool; and, performing a plurality of back-end post-exposure photoresist-related functionality on the wafer, the wafer moving on the second track farther away from the exposure tool after each back-end post-exposure photoresist-related functionality is performed.

6. The method of claim 5, wherein the front-end pre-exposure photoresist-related functionality and the front-end post-exposure photoresist-related functionality are performed using a first track having a single path to and from the exposure tool, and back-end pre-exposure photoresist-related functionality and the back-end post-exposure photoresist related functionality are performed using a second track having a single path to and from the exposure tool.

7. The method of claim 5, wherein the front-end pre-exposure photoresist-related functionality, the front-end post-exposure photoresist-related functionality, the back-end pre-exposure photoresist-related functionality, and the back-end post-exposure photoresist related functionality are performed using a single track having both a front-end path and a back-end path to and from the exposure tool.

8. The method of claim 5, wherein the front-end pre-exposure photoresist-related functionality and the back-end pre-exposure photoresist-related functionality each comprise photoresist application and photoresist soft-baking.

9. The method of claim 5, wherein the front-end post-exposure photoresist-related functionality and the back-end post-exposure photoresist-related functionality each comprise photoresist development and photoresist hard-baking.

* * * * *